(12) United States Patent
Lee (10) Patent No.: US 8,268,536 B2
(45) Date of Patent: Sep. 18, 2012

(54) ELECTRODE FORMATION BASED ON PHOTO-INDUCED REDUCTION OF METAL IONS IN THE PRESENCE OF METAL NANOMATERIALS

(75) Inventor: Kwangyeol Lee, Namyangju-si (KR)

(73) Assignee: Korea University Research and Business Foundation, Seoul (KR)

( * ) Notice: Subject to any disclaimer, the term of this patent is extended or adjusted under 35 U.S.C. 154(b) by 1055 days.

(21) Appl. No.: 12/202,139

(22) Filed: Aug. 29, 2008

(65) Prior Publication Data
US 2010/0051091 A1 Mar. 4, 2010

(51) Int. Cl.
*H01B 13/00* (2006.01)
(52) U.S. Cl. .................. 430/319; 430/311; 430/324
(58) Field of Classification Search .................. None
See application file for complete search history.

(56) References Cited

FOREIGN PATENT DOCUMENTS

| JP | 62-001874 A | * | 1/1987 |
|---|---|---|---|
| JP | 11-246977 A | * | 9/1999 |
| JP | 2005-332612 A | | 12/2005 |
| KR | 10-2005-0097956 A | | 10/2005 |
| KR | 10-2006-0017776 A | | 2/2006 |
| KR | 10-0762258 B1 | | 9/2007 |

OTHER PUBLICATIONS

Computer-generated transaltion of JP 11-246977 (Sep. 1999).*

* cited by examiner

*Primary Examiner* — John A. McPherson
(74) *Attorney, Agent, or Firm* — Edwards Wildman Palmer LLP (57) ABSTRACT

Systems and methods of forming an electrode on a substrate are disclosed. The methods can include applying a solution including metal ions and metal nanomaterials to a surface of a substrate. The methods further can include exposing a selected portion of the solution with light having a wavelength capable of inducing reduction of the metal ions, wherein the selected portion corresponds to at least a portion of the electrode.

34 Claims, 5 Drawing Sheets

ELECTRODE FORMATION BASED ON PHOTO-INDUCED REDUCTION OF METAL IONS IN THE PRESENCE OF METAL NANOMATERIALS

BACKGROUND

Description of the Related Technology

When manufacturing an electrode for a solar cell, the electrode usually is formed on a silicon (Si) substrate. The characteristics of the electrode can be important for improving the power-generation characteristics of the solar cell. For example, the power-generation efficiency can be improved by reducing the resistance of the electrode. Generally, to form the electrode, a paste containing an electroconductive powder, such as a silver powder, is coated onto the substrate, followed by sintering.

Silver (Ag) electrodes are commonly used in silicon (Si) solar cells due to their intrinsically low resistivity. The Ag electrodes on Si solar cells can be fabricated with screen printing. However the screen printing technique cannot provide finer electrode features, for example, with dimensions of less than 50 μm. While an inkjet technique can produce finer electrode features, this technique is characterized by low throughput.

SUMMARY

In some aspects, there can be methods of forming an electrode on a substrate that can include applying a solution including metal ions and metal nanomaterials to a surface of a substrate. The methods can further include exposing a selected portion of the solution to light having a wavelength capable of inducing reduction of the metal ions and aggregation of reduced metal particles, wherein the selected portion corresponds to at least a portion of the electrode In other aspects, there can be methods of forming an electrode on a substrate that can include applying a solution including metal ions on a layer of metal nanomaterials formed on a surface of a substrate. The method can further include exposing a selected portion of the solution to light having a wavelength capable of inducing reduction of the metal ions, wherein the selected portion corresponds to at least a portion of the electrode.

In other aspects, there can be devices including a substrate and a patterned electrode formed over the substrate in which the patterned electrode can include a plurality of metal nanomaterials dispersed over the substrate. The patterned electrode can further include a plurality of metal particles aggregated in proximity to the metal nanomaterials, the metal particles having been reduced from metal ions by ultraviolet (UV) exposure.

In other aspects, there can be methods of forming an electrode on a substrate that can include inducing conversion of metal ions into metal particles in a first volume of an ionic solution layer by exposing the first volume to electromagnetic (EM) radiation. The methods can further include removing a second volume of the ionic solution layer unexposed to the EM radiation.

In other aspects, there can be electrodes including metal nanomaterials and aggregates of metal particles formed in the vicinity of the metal nanomaterials.

The foregoing is a summary and thus contains, by necessity, simplifications, generalization, and omissions of detail; consequently, those skilled in the art will appreciate that the summary is illustrative only and is not intended to be in any way limiting. Other aspects, features, and advantages of the devices and/or processes and/or other subject matter described herein will become apparent in the teachings set forth herein. The summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, computer programs and systems related to forming electrodes on a substrate.

Aspects of the present disclosure relate to methods of forming an electrode on a substrate. The methods can include inducing conversion of metal ions into metal particles in a first volume of an ionic solution layer by exposing the first volume to electromagnetic (EM) radiation and removing a second volume of the ionic solution layer unexposed to the EM radiation.

Figure 1A:
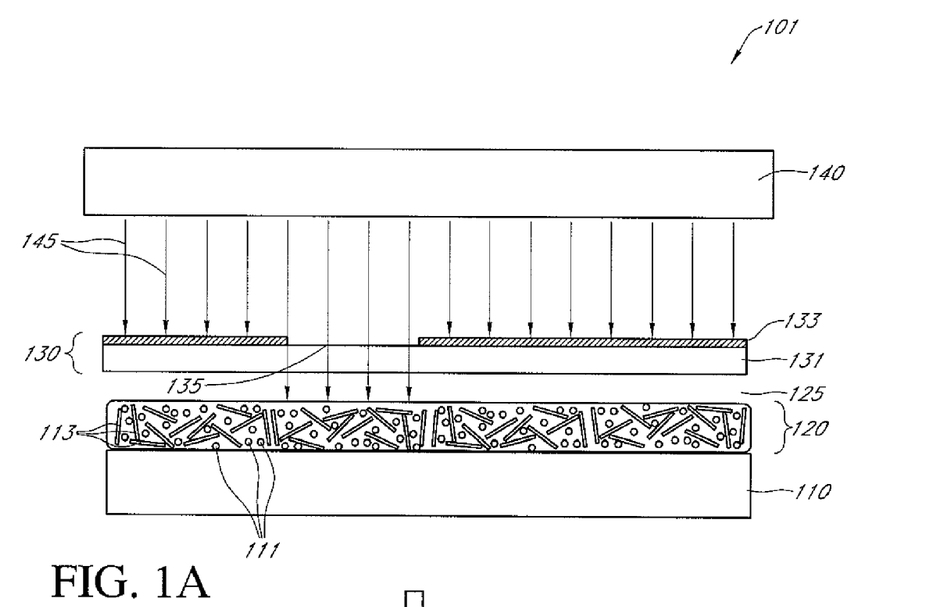
FIG. 1A shows a photolithography (PL) setup that can be used for fabricating a patterned electrode by a photo-induced reduction process according to one embodiment.
Figure 1B:
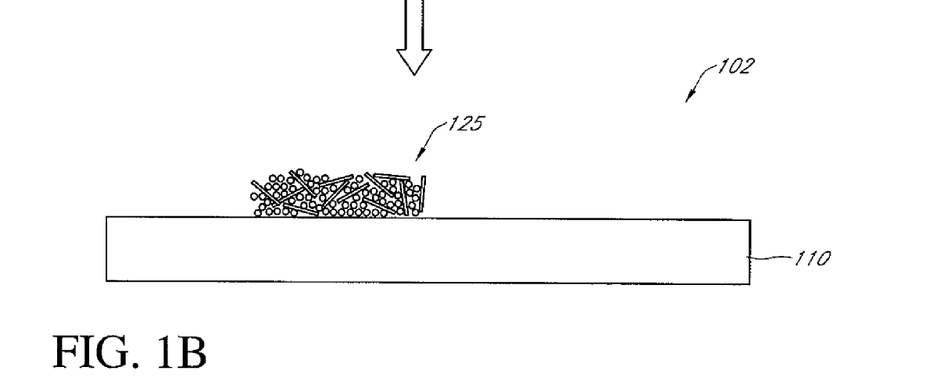
FIG. 1B shows a patterned electrode that can be produced by the PL setup of FIG. 1A.

FIGS. 1A and 1B show schematic diagrams illustrating fabrication of a patterned electrode by an example of a photo-induced reduction process according to one embodiment. In particular, FIG. 1A shows a photolithography (PL) setup 101 that can be used for the example fabrication process, and FIG. 1B shows a patterned electrode 125 that can be produced by the example fabrication process. Turning to FIG. 1A, the PL setup 101 includes a substrate 110, an ionic solution layer 120 formed over the substrate, a photomask 130 disposed over the ionic solution layer 120 with or without an intervening air gap there between, and a light source 140 placed above the photomask 130 with or without an air gap there between. As used herein, the term "ionic solution layer" refers to a layer of a liquid or semi-liquid including metal ions either deposited or otherwise formed over a substrate. Various examples of forming the ionic solution will be given below with respect to FIGS. 2A-2D. The substrate 110 can be formed from various insulating or semiconducting materials including silicon, silicon oxides, polycarbonates, polymer films, and the like The ionic solution layer 120 can include metal ions 111 (represented for illustration purposes only by the small circles) and metal nanomaterials 113 (represented by the rods). In some embodiments, the metal ions 111 can be silver ions (Ag+), for example, formed by dissolving silver compounds that are soluble in the particular solvent used. The solvent that can be used can include water, alcohol, a mixture thereof, or any other suitable solvent, including solvents for the particular metal salt that is used. Examples of silver compounds that can be used for this purpose include water soluble silver salts such as silver nitrate (AgNO3), silver nitrite (AgNO2), silver trifluoroacetate (AgOOCCF3), and the like. In other embodiments, the metal ions can be gold (Au+) ions formed by dissolving gold compounds in a solvent. Examples of gold compounds that can be used include water soluble gold salts such as gold (I) chloride (AuCl), gold (III) chloride (AuCl$_3$), gold iodide (AuI), and the like. In yet other embodiments, the metal ions can be ions of copper (Cu) or any other metal or combination of metals that can be reduced when exposed to light and that can conduct electricity when aggregated in the presence of metal nanomaterials.

The metal nanomaterials 113 also can be in various forms including, for example, nanoparticles, nanorods, nanowires, nanoclusters, nanoplates, and the like. The metallic nanomaterials 113 can be formed of various metals including silver and gold. In some embodiments, the metallic nanomaterials can include a metal such as for example gold (Au), silver (Ag), copper (Cu), nickel (Ni), iron (Fe), palladium (Pd), platinum (Pt), rhodium (Rh), ruthenium (Ru), osmium (Os), cobalt (Co), tungsten (W), combination thereof, or any other suitable electrically conductive material. In other embodiments, the metal nanomaterials 113 can include a binary or ternary electrically conductive alloy where at least one of the constituent elements is a metal such as for example gold (Au), silver (Ag), copper (Cu), nickel (Ni), iron (Fe), palladium (Pd), platinum (Pt), rhodium (Rh), ruthenium (Ru), osmium (Os), cobalt (Co), tungsten (W), and the like or another any other suitable conductive alloy or material. In one embodiment, the nanomaterial 113 used can be silver or gold nanowires having a diameter in the range of 2-10 nm and a length in the range of 100 nm to 5 μm. Size of the nanomaterial to be used can depend on the relevant dimension, e.g., width and thickness, of the electrode structure to be formed. For examples when the relevant electrode dimension (e.g., width and/or thickness) is in the range of microns, the nanomaterial size (e.g., diameter) can be in the range of hundreds of nanometers, although smaller-sized materials can also be used. If the relevant electrode dimension is in the range of tens or hundreds of nanometers, on the other hand, much smaller nanomaterials in the range of 3-30 nm can be used, although larger materials also can be used.

The photomask 130 can include a mask substrate 131, typically a fused quartz, for example, covered with a blocking layer 133, typically chrome, for example. It should be noted that any other suitable mask and blocking layer materials that can substantially stop or attenuate transmission of light in the wavelength of interest can be used. An electrode pattern can be formed on the blocking layer 133 such that it includes an opening or aperture 135 which can provide a clear path for a portion of incident light 145 to travel through. In certain embodiments, the light source 140 can be an ultraviolet (UV) light source such as, for example, gas-discharging lamps using mercury alone or in combination with noble gases such as xenon in the range of wavelengths between 300 to 500 nm. In other embodiments, the UV light source can be, for example, excimer lasers producing deep UV light of wavelength below 300 nm including a 248 nm spectral line (krypton fluoride) and a 193 nm spectral line (argon fluoride). Yet in other embodiments, the photolithography can be extended features below 50 nm using 193 nm and liquid immersion techniques. Also known as immersion lithography, this technique can facilitate the use of optics, e.g., lenses, with numerical apertures exceeding 1.0. In some of such embodiments, the ionic solution layer 120 can provide for a refractive index above that of the usual air gap.

In operation, a portion of the incident light 145 passes through the opening or aperture 135 in the photomask 130 and exposes or illuminates an area of the liquid solution layer 120. The exposed or illuminated area can have an identical (1:1) or a proportional but non-identical correspondence with the electrode pattern on the photomask 133, depending on the size of an air gap between the photomask 130 and the ionic solution layer 120 and/or additional optics, e.g., lenses, before or after the photomask 130. While the example PL setup 101 shows an air gap 125 between the ionic solution layer 120 and the photomask 130, the photomask 130 may be in a direct contact with the ionic solution layer 120 with no air gap in between. For the purpose of the following discussion, the metal ions are silver ions (Ag+) and the nanomaterials are gold (Au) nanowires. However, it should be appreciated in light of the present disclosure that the metal ions and nanomaterials can be of different combinations of materials. In the exposed area of the ionic solution layer 120, the UV light induces reduction of the Ag+ ions. The ionic reduction of certain metallic ions, such as Ag+ ions, can be facilitated by the presence of nanomaterials in the ionic solution. That is to say, the presence of the metal nanoparticles 113 (e.g., gold nanowires) in the ionic solution layer 120 advantageously can facilitate (e.g., increase the rate of) reduction of the metal (e.g., Ag+ ions) and aggregation of the reduced metal particles around the nanomaterials 113. After the UV exposure, the substrate having exposed and unexposed areas of the ionic solution layer can be washed, for example, with de-ionized water. The washing process removes the unexposed area of the ionic solution layer 120, while leaving behind the exposed area having the Ag aggregates and the Au nanomaterials as shown in FIG. 1B. When the volume diameter of the aggregate of nanoparticles exceeds ca. 100 nm, the solubility of the aggregate is negligible in aqueous solution. Thus, the aggregate simply sits down on the substrate below and strongly adheres to the substrate with further reduction of the salts. If the seed nanoparticles are already present on the substrate, the adhesion of the electrode can be much easier.

The combination of Ag aggregates and Au nanomaterials can form a highly conductive patterned electrode that can be used in solar cell and display devices. For example, the displays in which the patterned electrodes can be used include liquid crystal displays (LCDs), plasma display panels (PDPs), and other display devices.

Figure 2A:
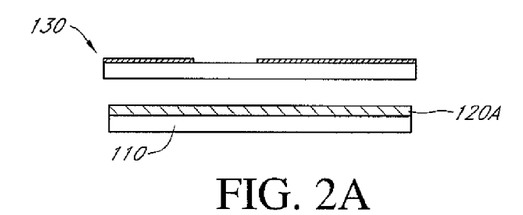
FIG. 2A shows an example method of forming an ionic solution layer.

FIGS. 2A-2D) show a variety of different methods of forming ionic solution layer(s) such as the ionic solution layer 120 as shown in FIG. 2A. In certain embodiments, a self standing ionic solution layer 120A can be formed by spin or spray coating the ionic solution onto the substrate 110 as illustrated in FIG. 2A. In some of such embodiments, certain polymer or other materials can be added to the ionic solution to increase its viscosity and adhesion properties.

Figure 2B:
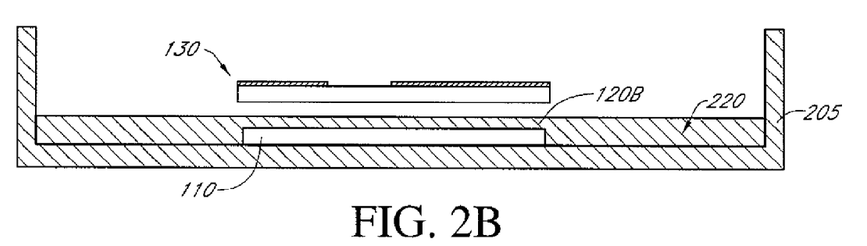
FIG. 2B shows another example method of forming an ionic solution layer.

In other embodiments, an ionic solution layer 120B can be formed by immersing the substrate 110 in an ionic solution bath 220 inside a container 305 with the top level of the ionic solution rising above the top of the substrate 110 as shown in FIG. 2B. The top level of the ionic solution bath 220 and the top of the substrate 110 constitute upper and lower sides, respectively, of the ionic solution layer 120B. In some of these embodiments, there can be an air gap between the ionic solution layer 120B and the photomask 130 as shown in the figure.

Figure 2C:
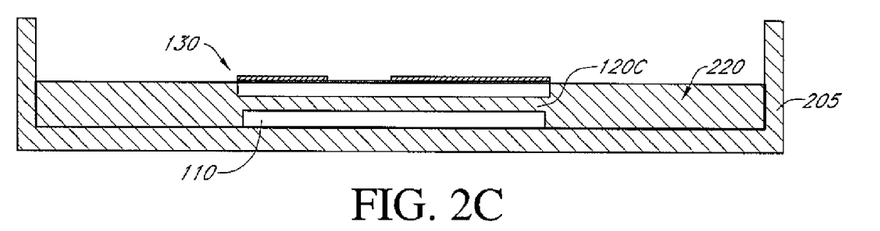
FIG. 2C shows yet another example method of forming an ionic solution layer.

In other embodiments, an ionic solution layer 120C can be formed by immersing the substrate 110 in an ionic solution bath 220 inside a container 205 with a photomask 130 placed over the substrate 110 with a liquid gap constituting the ionic solution layer 120C as shown in FIG. 2C. In some of such embodiments, the photomask can be in direct contact with the ionic solution layer 120C without an air gap in between as shown in the figure.

Figure 2D:
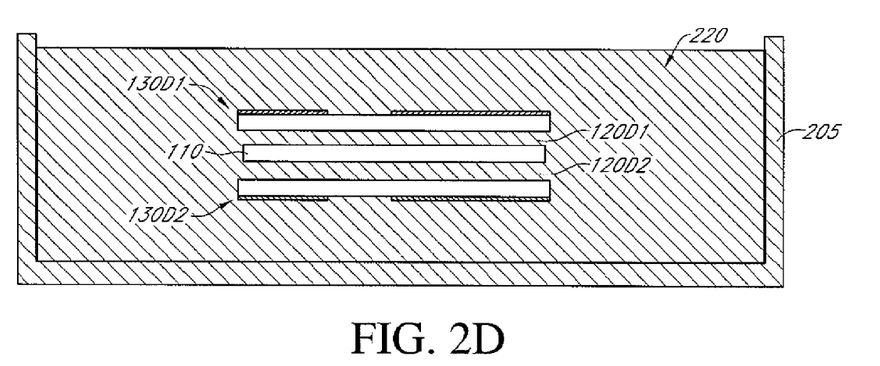
FIG. 2D shows an example method of forming two ionic solution layers.

In other embodiments, dual ionic solution layers 120D1, 120D2 can be formed from liquid gaps formed on both sides of a substrate 110 by placing a top photomask 130D1 a bottom photomask 130D2 over and under the substrate 110, respectively, inside a liquid bath 220 inside a container 205 as shown in FIG. 2D. This configuration permits patterned electrodes to be formed on two sides of the substrate 110.

FIGS. 2A-2D are non-limiting and show just a few of the possible configurations that can be used to pattern one or more electrodes of varying sizes and contours on a substrate. While the photomasks shown in FIG. 2A-2D show only one opening or aperture, it should be appreciated in light of this disclosure that the photomasks can include more than one opening to permit patterning of multiple electrodes. The openings can be of different sizes and shapes such as, for example, rectangles, triangles, circles, trapezoids, ovals, and the like.

Figure 3:
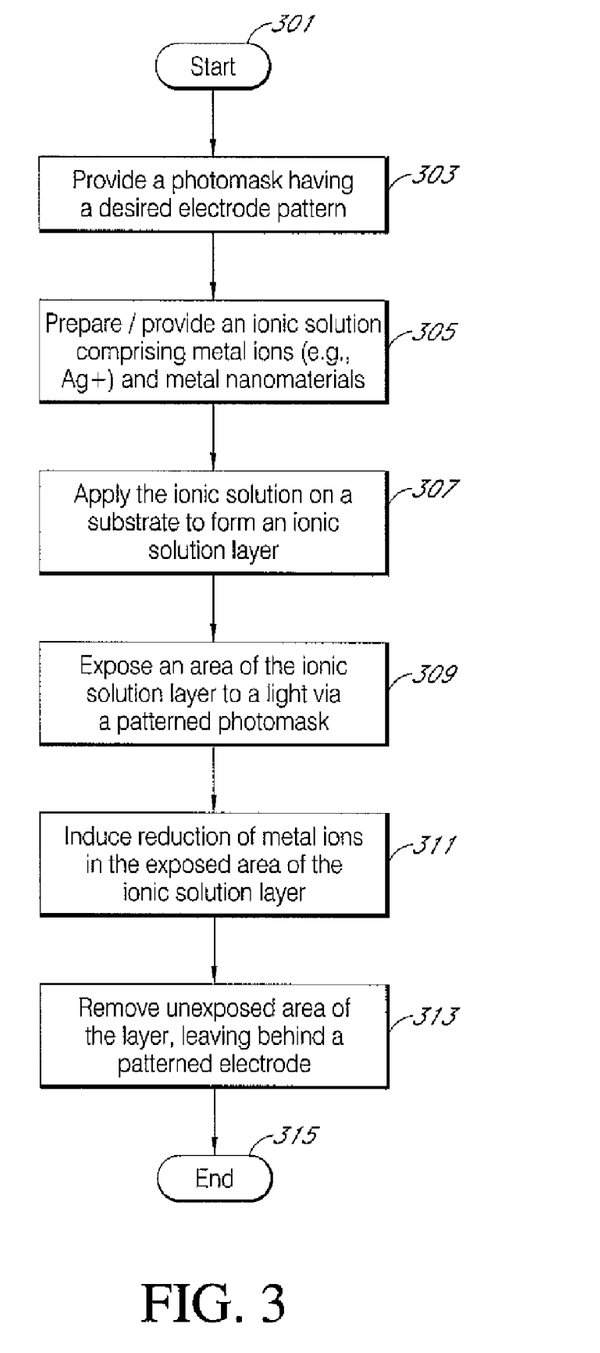
FIG. 3 shows a flowchart illustrating an example process for fabricating a patterned electrode by a photo-induced reduction process such as illustrated by FIGS. 1A and 1B.

FIG. 3 shows a flowchart illustrating an example process 300 for fabricating a patterned electrode by a photo-induced reduction process such as illustrated by FIGS. 1A and 1B. The process 300 starts at a start state 301 and proceeds to a state 303, where a photomask such as for example photomask 130 (FIG. 1A) having a desired electrode pattern is provided and/or prepared. The photomask can be formed, for example, by plating or coating a fused quartz substrate with chrome and etching an electrode pattern on the chrome coating. The process 300 proceeds to a state 305, where an ionic solution including metal ions (e.g., Ag+ or Au+) and metal nanomaterials (e.g., Ag or Au nanoparticles, nanorods, nanowires, nanoplates) is prepared or provided. The preparation can include, for example, dissolving water soluble salts containing silver (Ag) or gold (Au) in water to produce an aqueous solution including Ag+ or Au+ ions and also adding Au or Ag nanomaterials to the solution. The process 300 proceeds to a state 307, where an ionic solution layer such as for example ionic solution layer 120 (FIG. 1A) is formed on a substrate by applying an ionic solution including the metal ions and metal nanoparticles on the substrate. The ionic solution layer can be formed by many different ways including the methods illustrated by FIGS. 2A-2D. In light of the present disclosure it shall be appreciated that some states can be done in a different order or done at the same time. For example, the states 305 and 307 can occur before or at the same time as the state 303.

The process 300 proceeds to a state 309, where an area of the ionic solution layer is exposed to UV light that passes through a patterned aperture such as for example patterned aperature 135 (FIG. 1A) of the photomask 130. The process 300 proceeds to a state 311, for example, where reduction of metal ions into metal particles (e.g., from Ag+ to Ag particles) and aggregation of the reduced metal particles with the nanomaterials can be induced by the UV light in the exposed area of the ionic solution layer. As discussed above, the photo-induced ionic reduction can take place preferentially in the vicinity of nanomaterials such as gold nanowires so as to form aggregates of reduced metal particles (e.g., Ag aggregates) surrounding the nanomaterials. In certain embodiments, a reducing agent such as hydroquinone ($C_6H_4(OH)_2$) or sodium borohydride (NaBH4) can be used to further facilitate the photo-induced ion reduction and aggregation process. The process 300 further proceeds to a state 313, where the unexposed area of the ionic solution layer is removed or washed away. For example, after a period of UV exposure, the substrate with the exposed and unexposed areas of ionic solution layer formed thereon can be subjected to a flow of de-ionized water, or other suitable material. The water flow removes the unexposed area of the ionic solution layer while leaving behind the exposed area including the metal nanomaterials and the metal aggregates formed in the vicinity. The exposed area thus left behind can constitute the patterned electrode. In light of the present disclosure it shall be appreciated that one or more additional processing states are possible such as a heat and/or chemical treatment of the patterned electrode to improve its adhesion to the substrate. The process 300 ends at state 315.

Figure 4A:
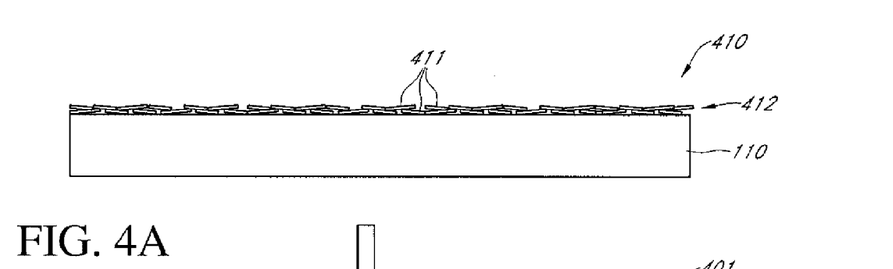
FIG. 4A shows a coated substrate having a nanomaterial layer according to one embodiment.
Figure 4B:
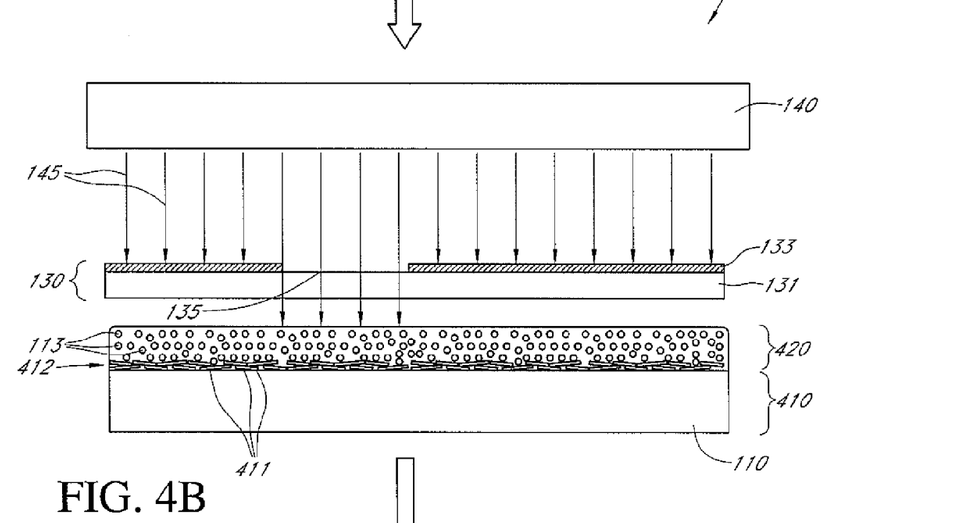
FIG. 4B shows a photolithography (PL) setup that can be used for fabricating a patterned electrode by an example photo-induced reduction process according to another embodiment.
Figure 4C:
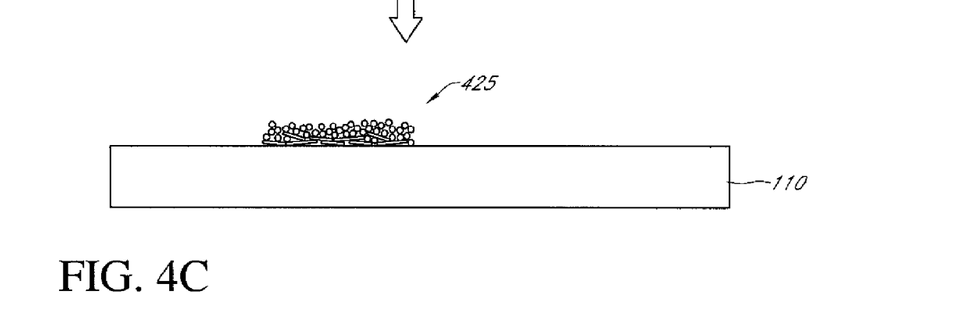
FIG. 4C shows a patterned electrode that can be produced by the example fabrication process of FIG. 4B.

As discussed above, the metal nanomaterials, which facilitate the reduction and aggregation process for the metal ions, can be added to the ionic solution and applied to the substrate together with the metal ions to form the ionic solution layer. Alternatively, the metal nanomaterials can be separately applied (e.g., coated) to form a metal nanomaterial layer on a substrate prior to forming the ionic solution layer. FIGS. 4A-4C show schematic diagrams illustrating an example process for fabricating a patterned electrode by a photo-induced reduction process involving an underlying nanomaterial layer according to one embodiment. FIG. 4A shows a coated substrate 410 having a nanomaterial layer 412 including nanomaterials 411. In one embodiment, the nanomaterial layer 412 of the coated substrate 410 can be formed, for example, by a deposition, e.g., spray coating or inkjet printing, of nanomaterials (e.g., Ag nanowires) onto a substrate 110. It should be understood that any of many different deposition processes can be used to coat the nanomaterial onto the substrate. For example, a gold nanomaterial layer can be formed by spray coating a gold (Au)-organic precursor onto a heated substrate. Alternatively, preformed nanoparticles can be dispersed in water and be spray-coated onto a substrate. The substrate 110 can be formed, for example, from various insulating or semiconducting materials including silicon, silicon oxides, polycarbonates, polymer films, and the like.

In some embodiments, the degree (e.g., time/thickness) of the gold (Au) nanomaterial coating can be controlled such that the nanomaterial layer so formed contains just enough nanomaterials to facilitate the photo-induced ionic reduction in the ionic solution to be applied over the nanomaterial layer. For example, the nanomaterial layer may not have enough gold nanomaterials to achieve a working electrode (e.g., an electrode with a high conductivity) by itself, but can have enough nanomaterials to facilitate formation of silver aggregates around the nanomaterials to achieve the working electrode when subjected to UV exposure. For example, in one embodiment, the nanomaterial layer may account for 2-5% of the weight of the total electrode including the nanomaterial layer and metal aggregates. In another embodiment, the nanomaterial layer may account for 5-10% of the weight. In yet another embodiment, the nanomaterial layer may account for 10%-20% of the weight. In yet another embodiment, the nanomaterial layer may account for 20%-50% of the weight.

FIG. 4B shows a photolithography (PL) setup 401 that can be used for the fabrication process involving the underlying nanomaterial layer. The PL setup 401 can include the coated substrate 410 (having the nanomaterial layer 412 formed thereon), an ionic solution layer 420 formed or dispersed on or over the coated substrate 410, a photomask 130 disposed over the ionic solution layer 420 with or without an intervening air gap, and a light source 140 placed above the photomask 130 again with or without an intervening air gap. The ionic solution layer 420 can include metal ions 111. As discussed with respect to FIG. 1A above, the metal ions 111 can be silver ions (Ag+), for example, formed by dissolving silver salts such as silver nitrate ($AgNO_3$), silver nitrite ($AgNO_2$), silver trifluoroacetate ($AgOOCCF_3$), and the like, in water ($H_2O$) (or other solvents) to form an aqueous (or other types of) ionic solution. Any other suitable metal ions can be used, for example, gold ions (Au+) or any other ions of metal that can be reduced and aggregated in the presence of metal nanomaterials when exposed to or illuminated with light of a certain wavelength and that can conduct electricity in the aggregate form in combination with the metal nanomaterials. Again, as discussed with respect to FIG. 1A above, the photomask can be a UV photomask, for example, formed from a fused quartz 131 covered with a patterned blocking layer 133 (e.g., chrome) with an aperture 135. In other embodiments, the PL setup 401 can include an immersion lithography technique that utilizes an ionic solution layer to provide for a refractive index above that of the usual air gap as discussed above. Depending on the type of lithography used, the light source 140 can be a UV lamp, an excimer laser, or any other suitable electromagnetic (EM) radiation source.

In operation, a portion of EM radiation such as UV light 145 incident on the photomask passes through the aperture 135 in the photomask 130 and exposes an area of the liquid solution layer 420. While the example PL setup shows an air gap between the ionic solution layer 420 and the photomask 130, the photomask 130 may be in direct contact with the ionic solution layer 420 with no air gap in between. In the exposed area of the ionic solution layer 120, the UV light induces reduction of the metal ions (e.g., Ag+). The presence of the metal nanomaterials 411 (e.g., gold nanowires) in the nanomaterial layer 412 facilitates formation of Ag aggregates around the nanomaterials 113. After the UV exposure, the substrate having exposed and unexposed areas of the ionic solution layer can be removed, for example, by washing with de-ionized water. The washing process can remove the unexposed area of the ionic solution layer 120, while leaving behind the exposed area including Ag aggregates formed around the underying Au nanomaterials as shown in FIG. 4C. The combination of metal (e.g., Au) nanomaterials and metal (e.g., Ag) aggregates can form a highly conductive patterned electrode that can be used for solar cell and display applications.

Figure 5:
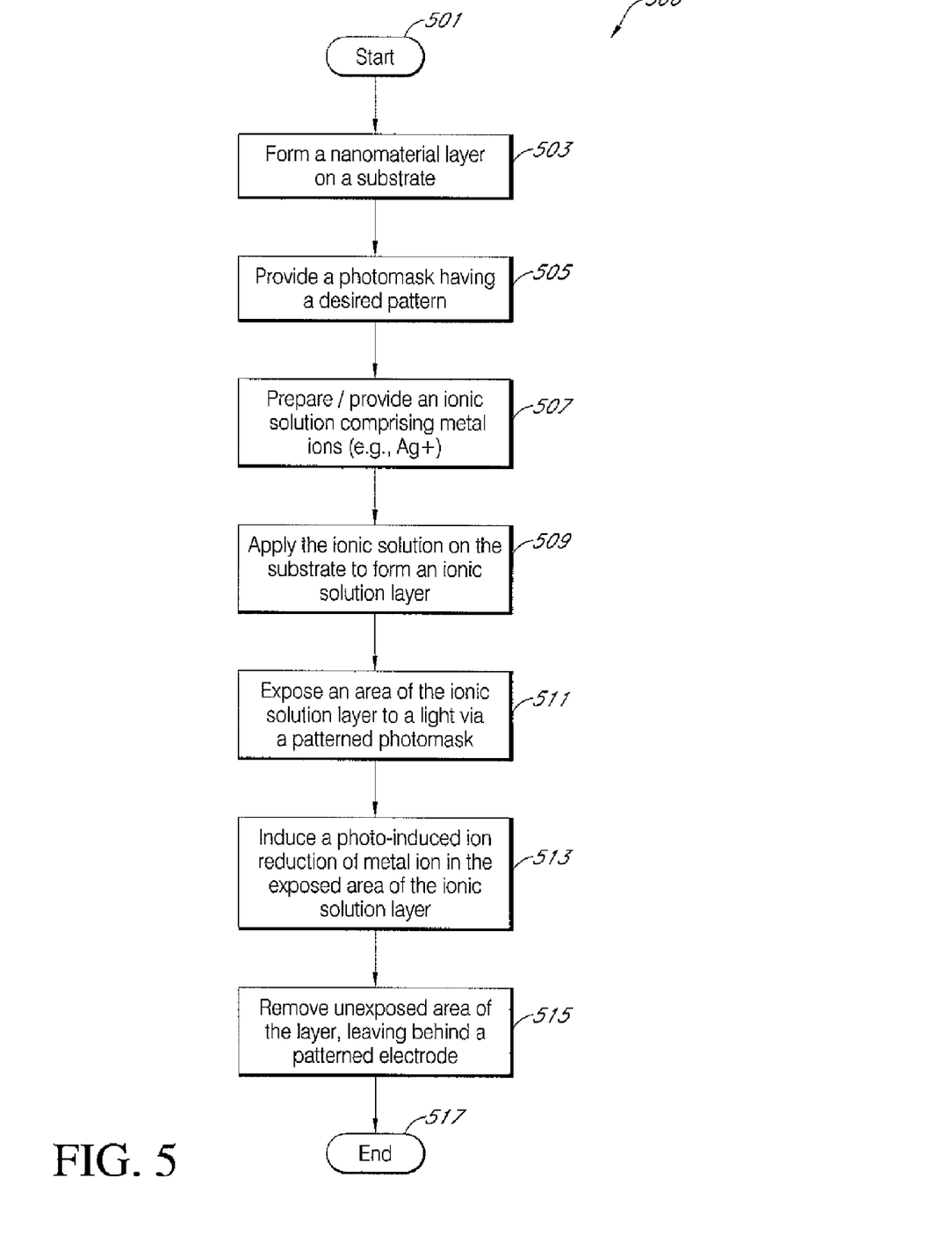
FIG. 5 shows a flowchart illustrating an example process for fabricating a patterned electrode by a photo-induced reduction process such as illustrated by FIGS. 4A-4C.

FIG. 5 shows a flowchart illustrating an example process 500 for fabricating a patterned electrode by a photo-induced reduction process such as illustrated by FIGS. 4A-4C. The process 500 starts at a state 501 and proceeds to a state 503, where a nanomaterial layer including metal nanomaterials (e.g., Au or Ag nanoparticles, nanorods, nanowires, nanoplates) is formed on a substrate. The process 500 proceeds to a state 505, where a photomask having a desired electrode pattern is provided. The process 500 proceeds to a state 507, where an ionic solution including metal ions (e.g., Ag+ or Au+) is prepared. The preparation can include dissolving water soluble salts containing silver (Ag) or gold (Au), for example, in water to produce an aqueous ionic solution including Ag+ or Au+ ions. In some embodiments, the ionic solution may include metal ions but not metal nanomaterials. In other embodiments, the ionic solution may include metal ions and also additional nanomaterials. In yet other embodiment, the ionic solution may also include a reducing agent such as hydroquinone ($C_6H_4(OH)_2$) or sodium borohydride (NaBH4). The process 500 proceeds to a state 509, where an ionic solution layer such as for example the ionic solution layer 420 is formed over or around the coated substrate 410 (FIG. 4B) by applying the ionic solution including the metal ions on the nanomaterial layer. The ionic solution layer can be formed by many different methods including methods similar to the methods discussed with respect to FIGS. 2A-2D. In light of the present disclosure it should be appreciated that some states such as 503, 505, 507, and 509, can be ordered differently. For example, the application of the ionic solution of the state 509 can be performed prior to the provision of the photomask having a desired pattern of the state 505.

The process 500 proceeds to a state 511, where an area of the ionic solution layer such as for example the ionic solution layer 420 formed over the underlying nanomaterial layer 412 is exposed to UV light passing through a patterned aperature such as for example the patterned aperture 135 (FIG. 4B). The process 500 proceeds to a state 513, reduction of metal ions in the exposed area of the ionic solution layer, for example, from Ag+ to Ag particles, is induced by the UV light in the exposed area of the ionic solution plus nanoparticle layers. As discussed above, the photo-induced ionic reduction takes place preferentially around nanomaterials such as gold nanowires so as to form aggregates of reduced metal particles in the vicinity of the nanomaterials. In this example, the metal (e.g., Ag) aggregates would form around the metal (e.g., Au) nanomaterials coated or otherwise formed over the substrate. In some embodiments, a reducing agent such as hydroquinone ($C_6H_4(OH)_2$) or sodium borohydride (NaBH4) further facilitate the photo-induced ion reduction and aggregation processes. The process 500 further proceeds to a state 515, where unexposed material is removed. For example, after a period of UV exposure, the substrate with exposed and unexposed areas of the ionic solution and nanomaterial layers can be subjected to a flow of de-ionized water to remove the unexposed or non-aggregated materials. The water flow removes the unexposed area while leaving behind the exposed area having the metal nanoparticle layer and the metal aggregates formed nearby. The exposed area thus left behind constitutes the patterned electrode. The process 500 ends at state 517.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of forming an electrode on a substrate, the method comprising:
   applying a solution comprising metal ions and metal nanomaterials to a surface of a substrate; and
   exposing a selected portion of the solution to light having a wavelength capable of inducing reduction of the metal ions, wherein the selected portion corresponds to at least a portion of the electrode.

2. The method of claim 1, wherein the metal ions in said selected portion of the solution are reduced by the light and form metal aggregates near the nanomaterials.

3. The method of claim 2, further comprising forming a patterned electrode that includes at least some of the metal aggregates and the metal nanomaterials by removing at least a portion of the applied solution that was not illuminated.

4. The method of claim 1, wherein the solution comprises a metal salt dissolved in an aqueous solution.

5. The method of claim 4, wherein the metal salt comprises a water soluble salt of silver.

6. The method of claim 5, wherein the salt of silver comprises silver nitrate (AgNO3), silver nitrite (AgNO2), or silver trifluoroacetate (AgOOCCF3).

7. The method of claim 4, wherein the metal salt comprises a water soluble salt of gold.

8. The method of claim 7, wherein the salt of gold comprises gold (I) chloride (AuCl), gold (III) chloride (AuCl3), or gold iodide (AuI).

9. The method of claim 1, wherein applying a solution comprises immersing the substrate in a bath of the solution with at least one ionic solution layer formed between the substrate and a photomask.

10. The method of claim 1, wherein applying a solution comprises spin coating a portion of the solution onto the substrate.

11. The method of claim 1, wherein exposing a selected portion of the solution to light causes a photo-induced reduction of Ag+ ions into Ag particles or of Au+ ions into Au particles.

12. The method of claim 1, wherein the solution further comprises a reducing agent that facilitates the photo-induced ion reduction.

13. The method of claim 12, wherein the reducing agent comprises hydroquinone or sodium borohydride (NaBH4).

14. The method of claim 1, wherein exposing a selected portion of the solution to light comprises directing ultraviolet (UV) light through a photomask.

15. The method of claim 1, wherein the nanomaterials comprise nanoparticles, nanorods, nanowires, nanoclusters, or nanoplates.

16. The method of claim 1, wherein the metal nanomaterials comprise one or more of a metal selected from a group consisting of gold (Au), silver (Ag), copper (Cu), nickel (Ni), iron (Fe), palladium (Pd), platinum (Pt), rhodium (Rh), ruthenium (Ru), osmium (Os), cobalt (Co), and tungsten (W).

17. The method of claim 16, wherein the metal of the metal nanomaterials matches the metal of the metal ions.

18. The method of claim 16, wherein the metal of the metal nanomaterials does not match the metal of the metal ions.

19. A method of forming an electrode on a substrate, the method comprising:
   applying a solution comprising metal ions on a layer of metal nanomaterials formed on a surface of a substrate; and
   exposing a selected portion of the solution to light having a wavelength capable of inducing reduction of the metal ions, wherein the selected portion corresponds to at least a portion of the electrode.

20. The method of claim 19, wherein the metal ions of the selected portion of the solution are reduced by the light and form metal aggregates near the nanomaterials.

21. The method claim 20, further comprising forming a patterned electrode that includes at least some of the metal aggregates and the metal nanomaterials by removing at least a portion of the applied solution that was not illuminated.

22. The method of claim 19, wherein the layer of metal nanomaterials comprises a metal-organic precursor spray coated on the substrate.

23. The method of claim 19, wherein the solution comprises a metal salt dissolved in an aqueous solution.

24. The method of claim 23, wherein the metal salt comprises a water soluble salt of silver.

25. The method of claim 24, wherein the salt of silver comprises silver nitrate (AgNO3), silver nitrite (AgNO2), or silver trifluoroacetate (AgOOCCF3).

26. The method of claim 19, wherein the metal nanomaterials comprise gold (Au) or silver (Ag).

27. The method of claim 19, wherein applying a solution comprises immersing the substrate in a bath of the solution with at least one liquid gap formed between the substrate and a photomask.

28. The method of claim 19, wherein the solution further comprises a reducing agent that facilitates the photo-induced ion reduction.

29. The method of claim 19, wherein the nanomaterials comprise nanoparticles, nanorods, nanowires, nanoclusters, or nanoplates.

30. The method of claim 19, wherein the metal nanomaterials comprise one or more of a metal selected from a group consisting of gold (Au), silver (Ag), copper (Cu), nickel (Ni), iron (Fe), palladium (Pd), platinum (Pt), rhodium (Rh), ruthenium (Ru), osmium (Os), cobalt (Co), and tungsten (W).

31. A method of forming an electrode on a substrate, the method comprising:
   inducing conversion of metal ions into metal particles in a first volume of an ionic solution layer on a substrate by exposing the first volume to electromagnetic (EM) radiation;
   removing a second volume of the ionic solution layer unexposed to the EM radiation; and
   providing metal nanomaterials to facilitate the conversion.

32. The method of claim 31, wherein the metal particles aggregate preferentially in the vicinity of the metal nanomaterials to form an electrode.

33. The method of claim 31, wherein the metal particles comprise silver aggregates.

34. The method of claim 31, wherein the metal nanomaterials comprise gold nanoparticles, nanorods, nanowires, nanoclusters, or nanoplates.

* * * * *